US012341002B2

(12) United States Patent
Bayati et al.

(10) Patent No.: US 12,341,002 B2
(45) Date of Patent: Jun. 24, 2025

(54) LOW STRESS FILMS FOR ADVANCED SEMICONDUCTOR APPLICATIONS

(71) Applicant: Lam Research Corporation, Fremont, CA (US)

(72) Inventors: Reza Bayati, Portland, OR (US); Bart J. van Schravendijk, Palo Alto, CA (US); Jonathan Church, Portland, OR (US); Keith Fox, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 752 days.

(21) Appl. No.: 17/310,132

(22) PCT Filed: Jan. 15, 2020

(86) PCT No.: PCT/US2020/013693
§ 371 (c)(1),
(2) Date: Jul. 19, 2021

(87) PCT Pub. No.: WO2020/159707
PCT Pub. Date: Aug. 6, 2020

(65) Prior Publication Data
US 2022/0068636 A1 Mar. 3, 2022

Related U.S. Application Data

(60) Provisional application No. 62/799,571, filed on Jan. 31, 2019.

(51) Int. Cl.
*H01L 21/02* (2006.01)
*H10B 41/20* (2023.01)

(52) U.S. Cl.
CPC ............. *H01L 21/02129* (2013.01); *H01L 21/02274* (2013.01); *H01L 21/02362* (2013.01); *H10B 41/20* (2023.02)

(58) Field of Classification Search
CPC ......... H01L 21/02129; H01L 21/02274; H01L 21/02362; H10B 41/20
See application file for complete search history.

(56) References Cited

U.S. PATENT DOCUMENTS 6,489,254 B1  12/2002  Kelkar et al.
6,599,574 B1   7/2003  Yieh et al.
(Continued)

FOREIGN PATENT DOCUMENTS

CN  105845549 A  8/2016
CN  107680970 A  2/2018
(Continued)

OTHER PUBLICATIONS

Huang J., et al., "Dependence of Film Properties of Subatmospheric Pressure Chemical Vapor Deposited Oxide on Ozone-to-Tetraethylorthosilicate Ratio" J. Electrochem. Soc., vol. 140, No. 6, Jun. 1993, pp. 1682.
(Continued)

*Primary Examiner* — Monica D Harrison
*Assistant Examiner* — Andre C Stevenson
(74) *Attorney, Agent, or Firm* — Weaver Austin Villeneuve & Sampson LLP

(57) ABSTRACT

Films that can be useful in large area gap fill applications, such as in the formation of advanced 3D NAND devices, involve processing a semiconductor substrate by depositing on a patterned semiconductor substrate a doped silicon oxide film, the film having a thickness of at least 5 μm, and annealing the doped silicon oxide film to a temperature above the film glass transition temperature. In some embodiments, reflow of the film may occur. The composition and processing conditions of the doped silicon oxide film may be tailored so that the film exhibits substantially zero as-
(Continued)

deposited stress, substantially zero stress shift post-anneal, and substantially zero shrinkage post-anneal.

17 Claims, 11 Drawing Sheets

(56) References Cited

U.S. PATENT DOCUMENTS

| | | | |
|---|---|---|---|
| 7,459,100 | B2 | 12/2008 | Kiermasz et al. |
| 7,674,727 | B2 | 3/2010 | Yuan et al. |
| 7,708,859 | B2 | 5/2010 | Huang et al. |
| 8,088,248 | B2 | 1/2012 | Larson |
| 8,357,618 | B2 | 1/2013 | Bencher et al. |
| 9,214,333 | B1 | 12/2015 | Sims et al. |
| 9,359,513 | B1* | 6/2016 | Takashima ............ C09D 11/107 |
| 2002/0052119 | A1 | 5/2002 | Van Cleemput |
| 2005/0199013 | A1* | 9/2005 | Vandroux ............ C03B 19/1469 65/391 |
| 2005/0277257 | A1 | 12/2005 | Byun et al. |
| 2006/0046508 | A1 | 3/2006 | Nemani et al. |
| 2007/0066038 | A1 | 3/2007 | Sadjadi et al. |
| 2012/0070957 | A1* | 3/2012 | Mallick ............ H01L 21/02208 257/E21.573 |
| 2013/0161629 | A1 | 6/2013 | Han et al. |
| 2014/0170847 | A1 | 6/2014 | Iuchi et al. |
| 2015/0255308 | A1 | 9/2015 | Lin et al. |
| 2015/0315704 | A1 | 11/2015 | Nakano et al. |
| 2016/0218002 | A1 | 7/2016 | Steinbrenner et al. |
| 2017/0125436 | A1 | 5/2017 | Sharangpani et al. |
| 2018/0144977 | A1 | 5/2018 | Yu et al. |
| 2019/0013203 | A1* | 1/2019 | Sreenivasan ...... H01L 29/66772 |
| 2019/0131140 | A1* | 5/2019 | Sun ........................ C09K 13/00 |
| 2019/0296012 | A1* | 9/2019 | Iwata ................ H01L 21/76834 |
| 2019/0345608 | A1 | 11/2019 | Agarwal et al. |
| 2020/0006374 | A1 | 1/2020 | Rabkin et al. |
| 2020/0051992 | A1 | 2/2020 | Liu et al. |
| 2020/0190664 | A1 | 6/2020 | Hu et al. |
| 2023/0178424 | A1 | 6/2023 | Bayati |
| 2023/0245896 | A1 | 8/2023 | Gupta et al. |

FOREIGN PATENT DOCUMENTS

| | | |
|---|---|---|
| CN | 108122734 A | 6/2018 |
| KR | 20150102738 A | 9/2015 |
| KR | 20170008690 A | 1/2017 |

OTHER PUBLICATIONS

International Search Report and Written Opinion dated Aug. 6, 2021 issued in Application No. PCT/US2021/028028.

International Search Report and Written Opinion dated May 28, 2020 issued in Application No. PCT/US2020/013693.

International Preliminary Report on Patentability and written opinion dated Nov. 17, 2022 in Application PCT/US2021/028028.

SG Search Report and Written Opinion dated Dec. 28, 2022 in Application No. SG11202108291S.

SG Written Opinion dated Sep. 29, 2023 in Application No. SG11202108291S.

TW Office Action dated Oct. 16, 2023, in application No. TW109102169 with English translation.

CN Office Action dated Jun. 26, 2024 in CN Application No. 202080012243 with English translation.

International Preliminary Report on Patentability and Written Opinion dated Feb. 2, 2023 in PCT Application No. PCT/US2021/042652.

International Search Report and Written Opinion dated Nov. 11, 2021, in PCT Application No. PCT/US2021/042652.

SG Written Opinion dated Mar. 19, 2024 in SG Application No. 11202108291S.

TW Office Action dated Jul. 2, 2024 in TW Application No. 109102169, with English Translation.

TW Office Action dated Mar. 22, 2024 in TW Application No. 109102169, with English Translation.

TW Office Action dated Dec. 17, 2024 in TW Application No. 110116166, with English Translation.

KR Office Action dated Oct. 18, 2024 in KR Application No. 10-2021-7027750 with English Translation.

CN Office Action dated Mar. 7, 2025 in CN Application No. 202080012243.0, with English Translation.

* cited by examiner

LOW STRESS FILMS FOR ADVANCED SEMICONDUCTOR APPLICATIONS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

As semiconductor devices continue to shrink, fabrication strategies are evolving. For example, 3D structures for increasing the density of elements fabricated on a semiconductor substrate have been developed. 3D NAND technology addresses challenges associated with two-dimensional NAND technology by stacking memory cells vertically in layers. However, these structures, and others in current and developing processing techniques, create additional challenges particularly for large area gap fill.

SUMMARY

Methods and apparatuses for processing semiconductor substrates, and semiconductor devices, are provided herein. Various described methods and apparatuses relate to films that can be useful in large area gap fill applications, such as in the formation of advanced 3D NAND devices.

One aspect involves a method of processing a semiconductor substrate by depositing on a patterned semiconductor substrate a doped silicon oxide film, the film having a thickness of at least 5 μm or at least 10 μm, or up to 20 μm or more, and annealing the doped silicon oxide film to a temperature above the film glass transition temperature. In some embodiments, reflow of the film may occur. The composition and processing conditions of the doped silicon oxide film may be tailored so that the film exhibits substantially zero as-deposited stress, substantially zero stress shift post-anneal, and substantially zero shrinkage post-anneal. For example, the doped silicon oxide film may be deposited by a chemical vapor deposition (CVD) process using precursors for silicon oxide and a dopant selected from the group consisting of B, P, Ge, and combinations thereof. The silicon oxide precursor may be tetraethyl orthosilicate (TEOS). The doped silicon oxide film may have a dopant concentration in the range of up to about 10 wt % of the film. An undoped silicon oxide capping layer may be deposited on the doped silicon oxide film. The patterned semiconductor substrate may be a 3D NAND structure having alternating oxide and nitride or polysilicon layers in a staircase pattern, and the doped silicon oxide film.

Another aspect involves a method of conducting a large area gap fill in fabrication of a 3D NAND structure. The method involves providing a patterned semiconductor substrate comprising a 3D NAND structure having alternating oxide and nitride or polysilicon layers in a staircase pattern, depositing on the patterned semiconductor substrate over the staircase pattern a doped silicon oxide film, the film having a thickness of at least 5 μm, or at least 10 μm, or 20 μm or more, and annealing the doped silicon oxide film to a temperature above the film glass transition temperature. In some embodiments, reflow of the film may occur. Thick films can be deposited at thicknesses up to 20 μm or more by a single-pass deposition. The doped silicon oxide film may be deposited at a high rate of at least 1 μm per minute. The doped silicon oxide film is deposited by a chemical vapor deposition (CVD) process using precursors for silicon oxide and a dopant selected from the group consisting of B, P, Ge, and combinations thereof. The silicon oxide precursor may be tetraethyl orthosilicate (TEOS), the doped silicon oxide film may have a dopant concentration in the range of up to about 10 wt % of the film, and the doped silicon oxide film on the substrate may exhibit substantially zero as-deposited stress, substantially zero stress shift post-anneal, and substantially zero shrinkage post-anneal. An undoped silicon oxide capping layer may be deposited on the doped silicon oxide film.

Another aspect involves a semiconductor device, including a 3D NAND structure having alternating oxide and nitride or polysilicon layers in a staircase pattern, and a doped silicon oxide film disposed and annealed on the staircase pattern, the film having a thickness of at least 5 μm. The doped silicon oxide film is doped with a dopant selected from the group consisting of B, P, Ge, and combinations thereof, and the doped silicon oxide film disposed and annealed on the staircase pattern exhibits substantially zero as-deposited stress, substantially zero stress shift post-anneal, and substantially zero shrinkage post-anneal.

Another aspect involves an apparatus for processing a semiconductor substrate by depositing on a patterned semiconductor substrate a doped silicon oxide film, the apparatus including: a reaction chamber including the substrate; a plasma source coupled to the reaction chamber and configured to generate a plasma outside the reaction chamber; one or more first gas inlets coupled to the reaction chamber; a second gas inlet coupled to the reaction chamber; and a controller including instructions for performing the following operations: depositing on a patterned semiconductor substrate disposed in the chamber a doped silicon oxide film, the film having a thickness of at least 5 μm; and annealing the doped silicon oxide film to a temperature above the film glass transition temperature. In some embodiments, reflow of the film may occur. The composition and processing conditions of the doped silicon oxide film may be tailored so that the film exhibits substantially zero as-deposited stress, substantially zero stress shift post-anneal, and substantially zero shrinkage post-anneal. For example, the doped silicon oxide film may be deposited by a chemical vapor deposition (CVD) process using precursors for silicon oxide and a dopant selected from the group consisting of B, P, Ge, and combinations thereof. The silicon oxide precursor may be tetraethyl orthosilicate (TEOS).

These and other aspects are described further below with reference to the drawings.

DETAILED DESCRIPTION

Figure 1:
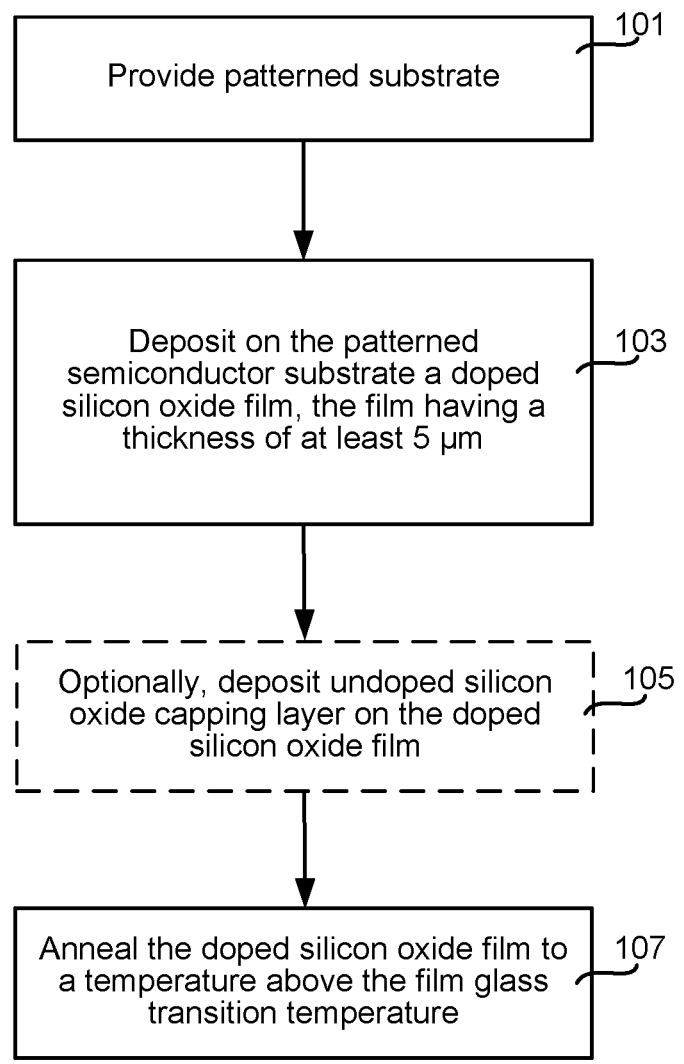
FIG. 1 is a process flow diagram depicting operations for a method of depositing and annealing a thick doped silicon oxide film, such as in large area gap fill applications.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The implementations disclosed below describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably.

Recent advances in semiconductor fabrication technology, have allowed for increasing the density of elements, such as memory cells in a memory device, on a substrate. For example, in 3D NAND technology tall structures are designed in order to improve device density scaling. New challenges arise from the increased size of these structures. As described herein, novel materials and processing techniques have been developed to address these challenges, including large area gap fill.

Large area gap fill challenges are encountered in the fabrication of taller structures, which involves deposition of thicker high-quality films. In 3D NAND, for example, thick silicon oxide films are used for isolation purposes. Conventional films suffer from a high stress that causes wafer bow and pattern distortion when the films are made thicker that, in turn, result in wafer handling problems and integration issues such as excessive lithography overlay and poor focus. For conventional silicon oxide films, lowering the film stress results in high moisture absorption which can lead to oxidation and high resistance in metal contacts. Also, these films have high stress shift and film shrinkage upon thermal treatment that amplifies the pattern distortion problems. In addition, demand for ever thicker films leads to ever increasing Chemical Mechanical Polish (CMP) time to planarize the device. So, it is desired to increase the CMP rate to reduce the overall processing cost of the device.

A sufficiently thick low stress film with high thermal stability, low moisture absorption and excellent dielectric properties, such as low dielectric constant and high breakdown voltage, would be desirable for large area gap fill and other applications in current and developing semiconductor processing techniques. For large area gap fill and other applications, such a film should allow low cost processing and avoid problems depositing to aggregate thicknesses exceeding 5 micrometers (microns (μm)), such as up to 10 μm or up to 20 μm, or more. Thick films can be deposited at thicknesses up to 20 μm or more by a single-pass deposition. The doped silicon oxide film may be deposited at a high rate of at least 1 μm per minute.

A candidate is a doped oxide film. However, the common industry method used for deposition of such films is subatmospheric chemical vapor deposition (SACVD). While SACVD can produce films with high CMP rate and low stress after annealing, the deposition rate is very slow which increases cost. In addition the films absorb moisture, shrink unacceptably and tend to crack when deposited to thicknesses of many micrometers.

As described herein, process regimes have been found to produce low stress, low stress shift, low shrinkage, low moisture absorption, no cracking thick films, with very high deposition rate (e.g., at least 1 μm per minute), high CMP rate and excellent dielectric quality. Such films can be useful in large area gap fill applications, for example, such as in the formation of advanced 3D NAND devices.

FIG. 1 is a process flow diagram depicting operations for a method of depositing and annealing a thick doped silicon oxide film, such as in large area gap fill applications. At 101, a patterned semiconductor substrate is provided, such as to a processing chamber of a chemical deposition tool. The method involves, at 103, depositing on a patterned semiconductor substrate a doped silicon oxide film, the film having a thickness of at least 5 μm, for example up to 10 μm, or up to 20 μm, or more. Thick films can be deposited at thicknesses up to 20 μm or more by a single-pass deposition. The doped silicon oxide film may be deposited at a high rate of at least 1 μm per minute. In some embodiments, the doped silicon oxide film deposition may be preceded by deposition of an undoped silicon oxide liner, for example having a thickness of about 200-2000 Å.

The composition and processing conditions of the doped silicon oxide film may be tailored so that the film exhibits substantially zero as-deposited stress, substantially zero stress shift post-anneal, and substantially zero shrinkage post-anneal. For example, the doped silicon oxide film may be deposited by a chemical vapor deposition (CVD) process using precursors for silicon oxide and a dopant selected from the group consisting of B, P, Ge, and combinations thereof. The silicon oxide precursor may be tetraethyl orthosilicate (TEOS). The CVD process may be plasma enhanced (PECVD).

Suitable dopant precursors are triethylborate (TEB), triethylphosphate (TEPO) and an organogermanium compound, for the B, P and Ge dopants, respectively, although others may be used. The doped silicon oxide film may have a dopant concentration in the range of up to about 10 wt % of the film; or 0.5 to 10%; or 2-5%; or 2.5-3.5%, and a dopant concentration in the range of about 0 to 10 wt % of the film B, 0 to 10% P, 0 to 10% Ge.

According to various embodiments, the properties of the deposited thick doped oxide film as described herein may be tuned to achieve a film of desired properties, for example compressive neutral or tensile. Suitable PECVD process conditions for such films are provided in Tables 1 and 2, below:

TABLE 1

PECVD process conditions for thick doped oxide film

| Film Stress | P (Torr) | LF Power (W) | HF Power (W) | TEOS flow (ml) | TEB (ml) | TEPO (ml) | Temperature (C) | Gap | O$_2$ (sccm) | Ar (sccm) | He (sccm) |
|---|---|---|---|---|---|---|---|---|---|---|---|
| Compressive film | 2.5-4 | 2300-3000 | 1500-2500 | 12-20 | 0.3-0.5 | 0.4-0.6 | 400-600 | 0.25-0.5 | 16000-25000 | 5000-9000 | 0-5000 |
| Neutral film | 3.5-5.5 | 1500-2500 | 500-2000 | 12-20 | 0.3-0.5 | 0.4-0.6 | 400-600 | 0.25-0.5 | 14000-20000 | 5000-9000 | 0-2000 |
| Tensile film | 4-6 | 1500-2500 | 500-1500 | 12-20 | 0.3-0.5 | 0.4-0.6 | 400-600 | 0.25-0.5 | 12000-17000 | 0-5000 | 0-2000 |

TABLE 2

PECVD process conditions for thick doped oxide film

| Film Stress | P (Torr) | LF Power (W) | HF Power (W) | TEOS flow (ml/min) | TEB (ml/min) | TEPO (ml/min) | Temp (° C.) | Gap | O$_2$ (sccm) | Ar (sccm) | He (sccm) |
|---|---|---|---|---|---|---|---|---|---|---|---|
| Compressive film | 2.5-4 | 2300-3000 | 500-3000 | 12-24 | 2-9 | 0.3-0.6 | 400-650 | 0.25-0.5 | 16000-25000 | 0-25000 | 0-25000 |
| Neutral film | 3.5-6 | 1000-2500 | 500-3000 | 12-24 | 2-9 | 0.3-0.6 | 400-650 | 0.25-0.5 | 14000-25000 | 0-25000 | 0-25000 |
| Tensile film | 4-7 | 1500-2500 | 500-3000 | 12-24 | 2-9 | 0.3-0.6 | 400-650 | 0.25-0.5 | 12000-25000 | 0-25000 | 0-25000 |

While specific precursor flow rates are noted, other flow rates can be used for other precursors.

In some embodiments, an undoped silicon oxide capping layer may optionally be deposited on the doped silicon oxide film, at 105, to protect the doped film from chemical reaction with ambient air. Such a suitable undoped capping layer may be a thin layer of about 200-400 Å, for example.

At 107, the doped silicon oxide film is then annealed to a temperature above the film glass transition temperature. At the glass transition temperature the film starts to relax and film stress is reduced. In some embodiments, the annealing of the doped silicon oxide film may cause reflow of the film to occur.

Post-deposition annealing may be performed on the substrate in the same processing chamber or a different processing chamber. In some examples, post annealing can be performed in a processing chamber for a period in a range from 20 to 60 minutes at a temperature in a range from 500° C. to 950° C. In some examples, the annealing can be performed nitrogen (N$_2$) or another inert gas. In some examples, the annealing is performed for 30 minutes at 750° C. in N$_2$.

Thick doped films deposited and annealed as described herein have been found to evidence increased film deformation after the annealing phase when compared to the as-deposited film. Film properties including deposition rates and stress shift were measured or calculated for doped and un-doped silicon oxide samples, showing higher rates and lower stress.

Neutral stress films, sometimes referred to as 0-0-0 films which exhibit substantially zero as-deposited stress, substantially zero stress shift post-anneal, and substantially zero shrinkage post-anneal, find use in important semiconductor processing applications, including the formation of isolation in 3D NAND devices.

Figure 2:
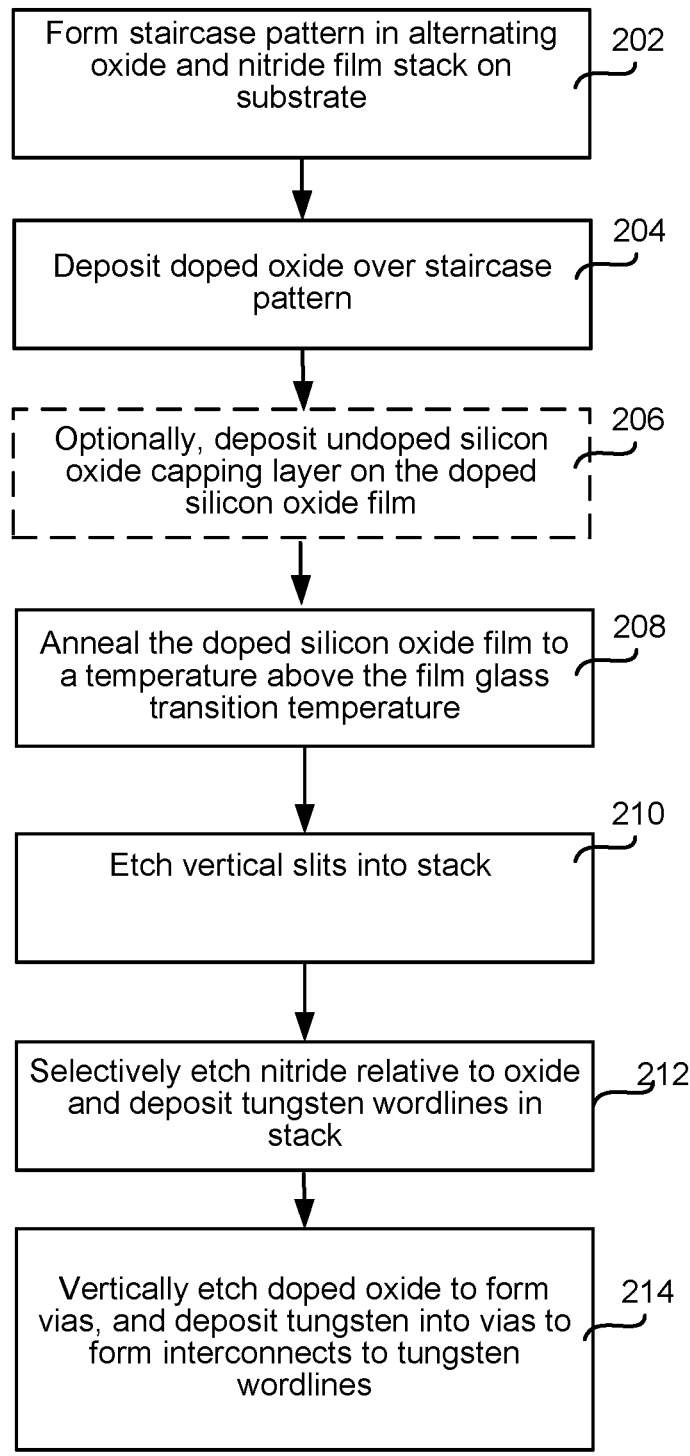
FIG. 2 is a process flow diagram depicting operations for a method of depositing and annealing a thick doped silicon oxide film in a 3D NAND fabrication context.
Figure 3:
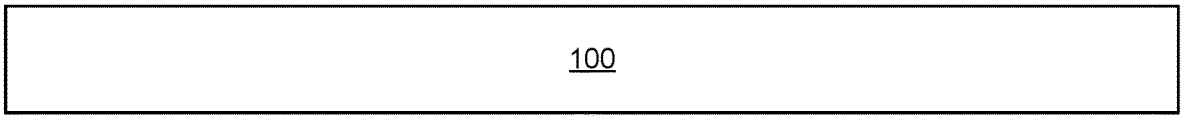
FIGS. 3-12 are schematic illustrations of depositing and annealing a thick doped silicon oxide film in a 3D NAND fabrication context.

FIG. 2 is a process flow diagram depicting operations for a method of depositing and annealing a thick doped silicon oxide film in a 3D NAND fabrication context. In operation 202, a staircase pattern of alternating oxide and nitride layers is formed on a substrate. In various embodiments, the substrate is a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon. An example substrate 100 is provided as a schematic illustration in FIG. 3.

In various embodiments, the oxide layer deposited is a silicon oxide layer. In various embodiments, the nitride layer deposited is a silicon nitride layer. Each oxide and nitride layer is deposited to about the same thickness, such as between about 10 nm and about 100 nm, or about 350 Å in some embodiments. The oxide layers may be deposited at a deposition temperature of between about room temperature and about 600° C., for example.

Oxide and nitride layers for forming the alternating oxide and nitride film stack may be deposited using any suitable technique, such as atomic layer deposition (ALD), plasma enhanced atomic layer deposition (PEALD), chemical vapor deposition (CVD), plasma enhanced chemical vapor deposition (PECVD), or sputtering. In various embodiments, the oxide and nitride layers are deposited by PECVD.

The film stack may include between 48 and 512 layers of alternating oxide and nitride layers, whereby each oxide or nitride layer constitutes one layer. The film stack including the alternating oxide and nitride layers may be referred to as an ONON stack.

Figure 4:
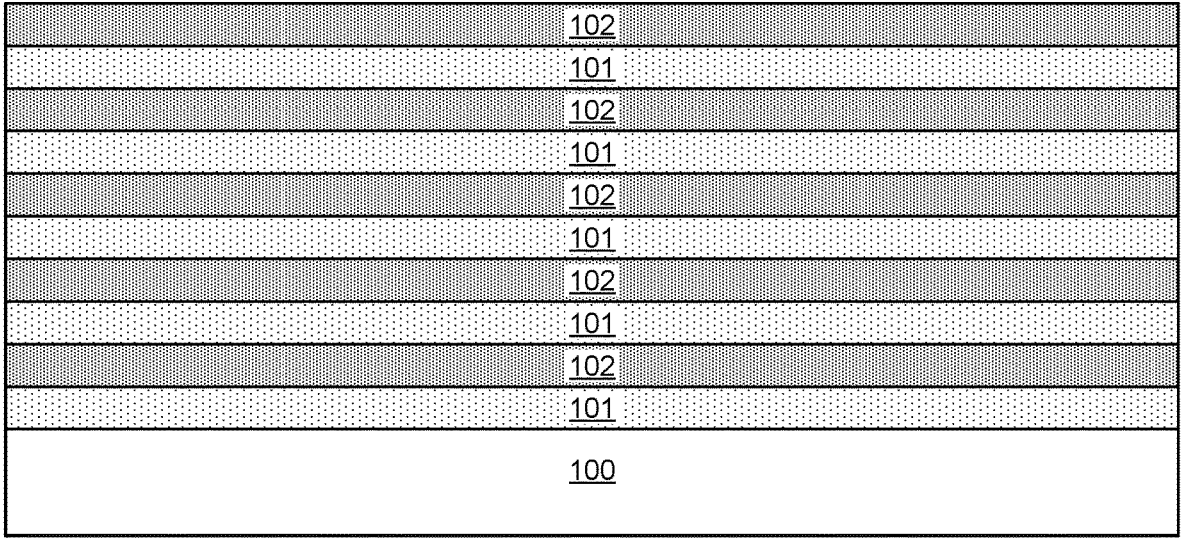

FIG. 4 shows an example schematic illustration of a substrate 100 with alternating oxide (101) and nitride (102) films deposited on the substrate 100. Note that while the structure shown in FIG. 4 shows an oxide deposited first, followed by nitride, oxide, nitride, etc., nitride may be deposited first, followed by oxide, nitride, oxide, etc.

Following deposition of the ONON stack, channels (not shown in FIG. 4) may be etched in the substrate. Subsequently, the staircase pattern is formed on the substrate. A "staircase pattern" as referred to herein includes two or more steps, each step including an oxide and a nitride layer. It will be understood that the top layer of each set of oxide and nitride layers may be either an oxide or a nitride for formation of steps in a staircase. In various embodiments, the staircase pattern includes between 24 and 256 steps, for example. The staircase pattern may be formed using a variety of patterning techniques. For example, one technique may include depositing a sacrificial layer over the substrate and masking regions of the substrate to etch each set of oxide and nitride layers to form the staircase.

Figure 5:
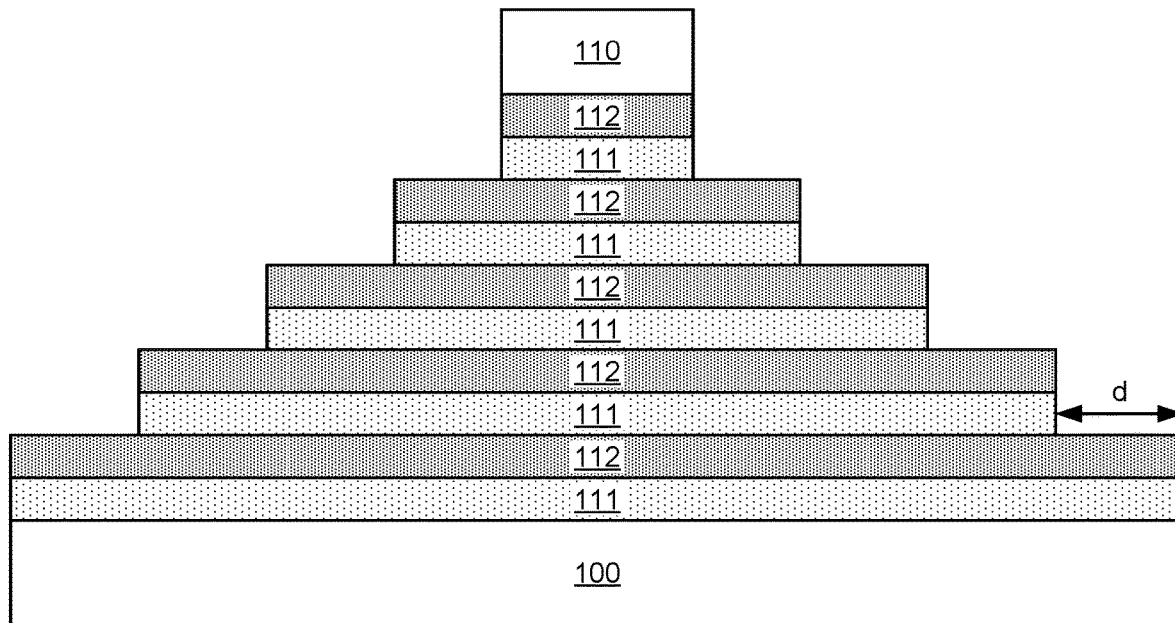

FIG. 5 provides an example of a substrate 100 including a staircase pattern of oxide (111) and nitride (112) layers with a hardmask 110 over the topmost nitride layer. Although FIG. 5 shows four steps of a staircase pattern, it will be understood that a staircase pattern will typically have many more steps, for example between 24 and 256 steps. Each step includes a nitride and oxide layer, and distanced as shown by "d" in FIG. 5 between, for example, about 150 nm and about 1000 nm, such as about 500 nm. This region of each step extending out from the edge of the step above it may be referred to as a "pad."

Figure 6:
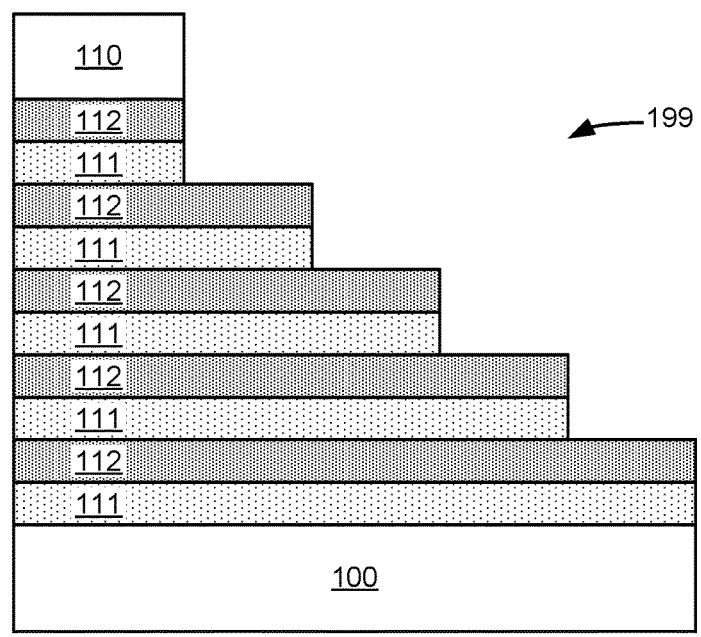

For purposes of discussion, the following discussion and subsequent schematic illustrations of the substrate will include a half view 199 as shown in FIG. 6.

Figure 7:
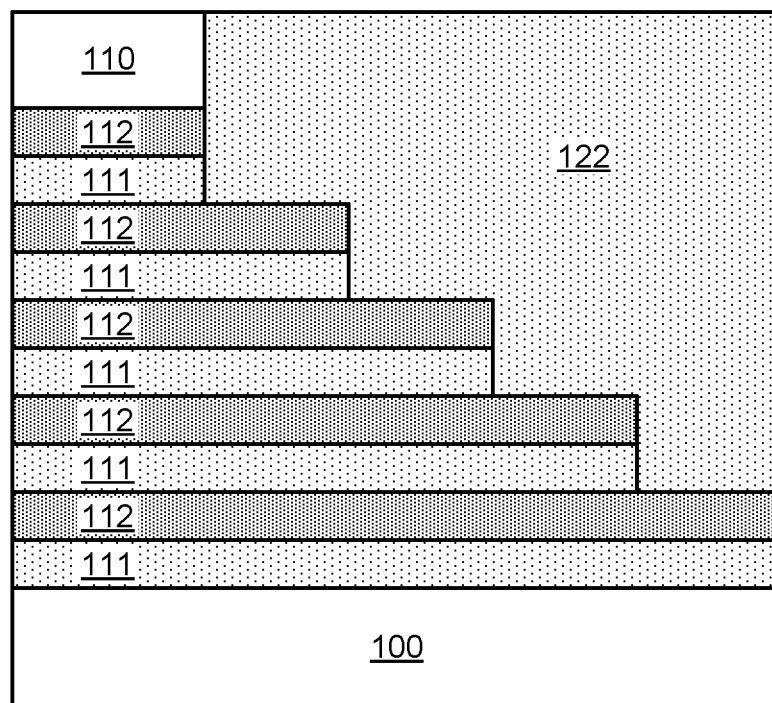

Returning to FIG. 2, in operation 204, a thick doped oxide film 122, at least 5 μm thick, and up to 10 μm or 20 μm thick, or more, as described herein, is deposited over the staircase pattern on the substrate. Thick films can be deposited at thicknesses up to 20 μm or more by a single-pass deposition. The doped silicon oxide film may be deposited at a high rate of at least 1 μm per minute. As described above, in various embodiments, the doped oxide film may be deposited by a chemical vapor deposition (CVD) process using precursors for silicon oxide and a dopant selected from the group consisting of B, P, Ge, and combinations thereof. The silicon oxide precursor may be tetraethyl orthosilicate (TEOS). The CVD process may be plasma enhanced (PECVD). Suitable dopant precursors are triethylborate (TEB), triethylphosphate (TEPO) and an organogermanium compound, for the B, P and Ge dopants, respectively, although others may be used. The doped silicon oxide film may have a dopant concentration in the range of up to about 10 wt % of the film; or 0.5 to 10%; or 2-5%; or 2.5-3.5%, and a dopant concentration in the range of about 0 to 10 wt % of the film B, 0 to 10% P, 0 to 10% Ge. In some embodiments, the doped silicon oxide film deposition may be preceded by deposition of an undoped silicon oxide liner, for example having a thickness of about 200-2000 Å. For this 3D NAND context, the deposited doped film may be tuned to be a 0-0-0 film, exhibiting substantially zero as-deposited stress, substantially zero stress shift post-anneal, and substantially zero shrinkage post-anneal. FIG. 7 shows an example substrate 100 including the ONON staircase, hardmask 110, and doped oxide film 122 deposited over the staircase.

Figure 13:
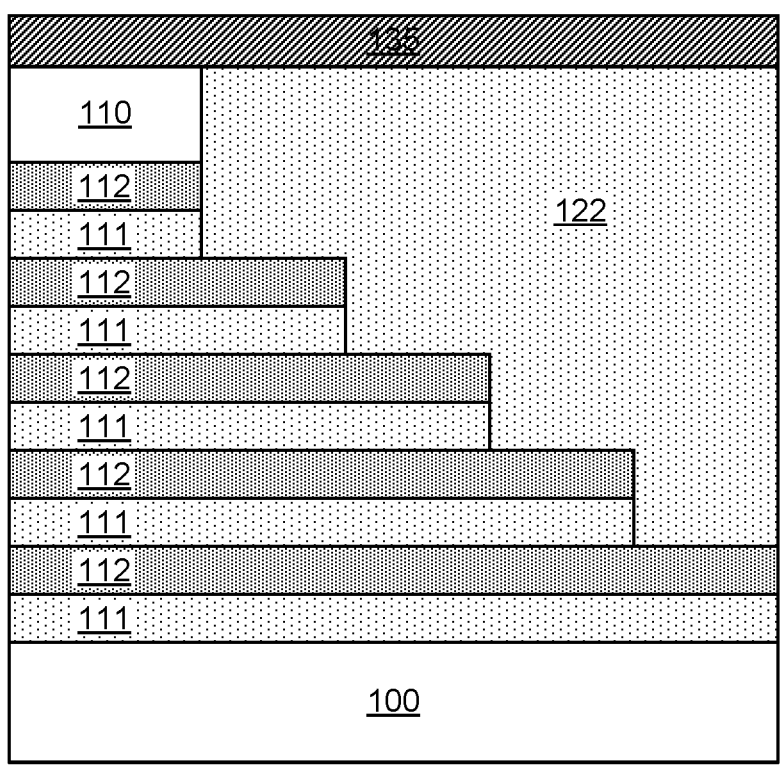
FIG. 13 is a schematic illustration of depositing a thin undoped silicon oxide capping layer over the thick doped silicon oxide film, to protect the doped film from chemical reaction with ambient air, in a 3D NAND fabrication context.

Referring to FIG. 13, and to FIG. 2, operation 206, in some embodiments, an undoped silicon oxide capping layer 135 may optionally be deposited on the doped silicon oxide film, at 107, to protect the doped film from chemical reaction with ambient air. Such a suitable undoped capping layer may be a thin layer of about 200-400 Å, for example.

Returning to FIG. 2, in operation 208, the doped silicon oxide film is then annealed the doped silicon oxide film to a temperature above the film glass transition temperature, as described above. In some embodiments, reflow of the film may occur.

Figure 8:
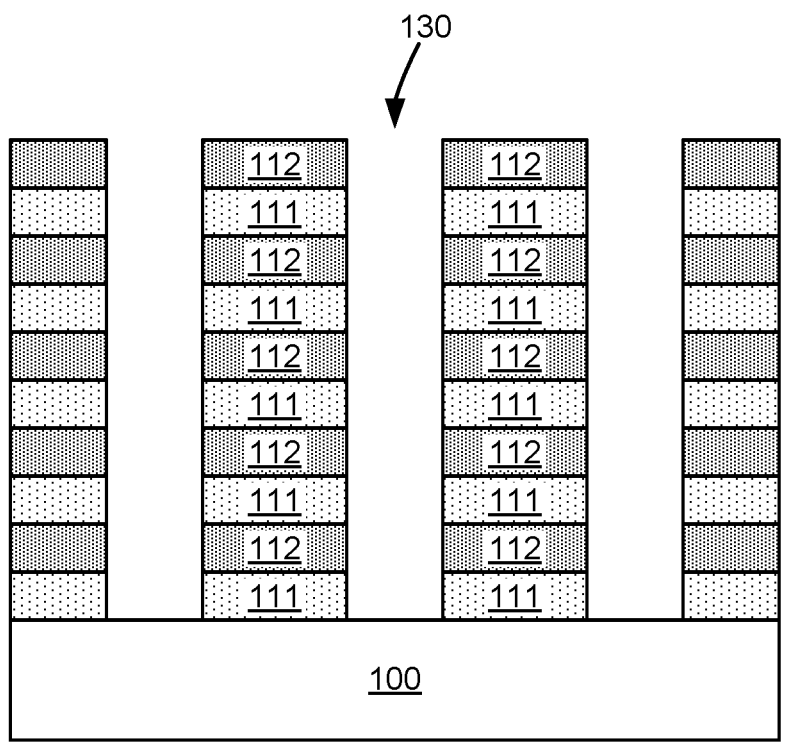

In operation 210, vertical slits 130 may be etched into the substrate after depositing and annealing the doped oxide film. FIG. 8 shows a side view of the substrate 100 after vertical slits 130 are etched.

Figure 9:
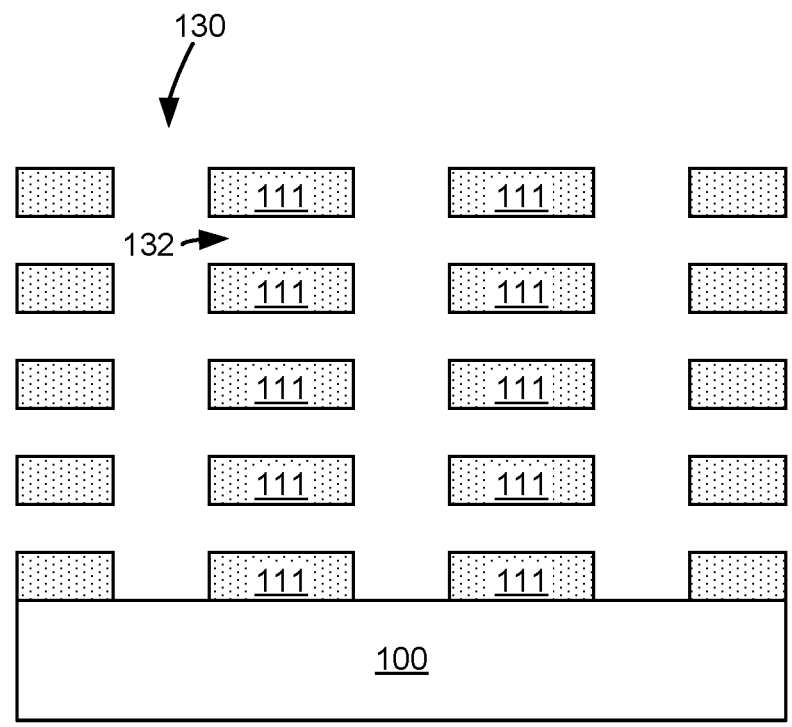

In operation 212, nitride in the ONON stack is etched relative to oxide on the substrate. Etching may be performed using a selective etch process, in which nitride is etched at a faster rate than etching of oxide. A suitable selective etch process may be dry or wet. For example, a suitable dry selective nitride etch may be conducted by exposing the substrate to any one or more of the following gases: chlorine ($Cl_2$), oxygen ($O_2$), nitrous oxide ($N_2O$), tetrafluoromethane (CF4), sulfur tetrafluoride ($SF_4$), carbon dioxide ($CO_2$), fluoromethane ($CH_3F$), nitrogen trifluoride ($NF_3$), nitrogen ($N_2$), hydrogen ($H_2$), ammonia ($NH_3$), methane ($CH_4$), sulfur hexafluoride ($SF_6$), argon (Ar), carbonyl sulfide (COS), carbon disulfide ($CS_2$), hydrogen sulfide ($H_2S$), and nitric oxide (NO). In this operation, etch species may flow into the vertical slits 130 and selectively laterally etch nitride, removing the nitride layers from the ONON stack. Alternatively, the nitride in the ONON stack may be etched using a wet etch process, such as by exposing the substrate to phosphoric acid ($H_3PO_4$) and/or diluted hydrofluoric acid ("DHF") or a mixture of these solutions. FIG. 9 shows an example schematic illustration of a substrate 100 with horizontal gaps 132 formed from etching nitride.

Figure 10:
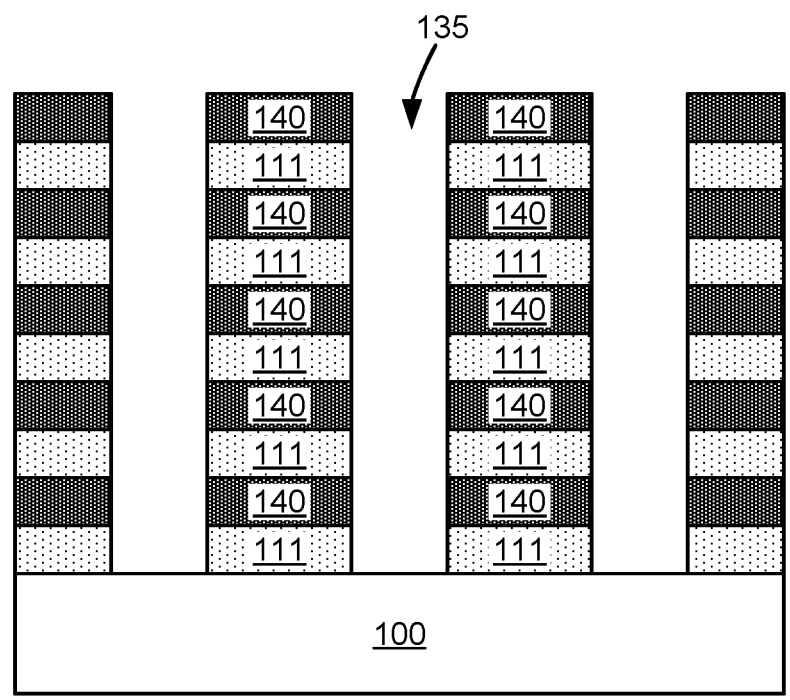

Further in operation 212, a conductor, typically tungsten, is deposited into the gaps of the substrate to form wordlines. Tungsten may be deposited by any suitable technique, such as ALD, CVD, PEALD, and/or PECVD. In some embodiments, a barrier layer and/or a tungsten nucleation layer is deposited prior to depositing bulk tungsten. FIG. 10 shows an example of a substrate 100 including deposited tungsten wordlines 140 where nitride 112 was previously.

It should also be understood that in other embodiments an alternative to the ONON stack may be a stack of deposited alternating dielectric and conductive layers. One example of this is a stack composed of alternating oxide polysilicon layers, sometimes referred to as an OPOP stack. Such an OPOP stack can be etched to form a staircase pattern according to known techniques, avoiding the need for nitride replacement with W in the ONON stack, as described above.

Figure 11:
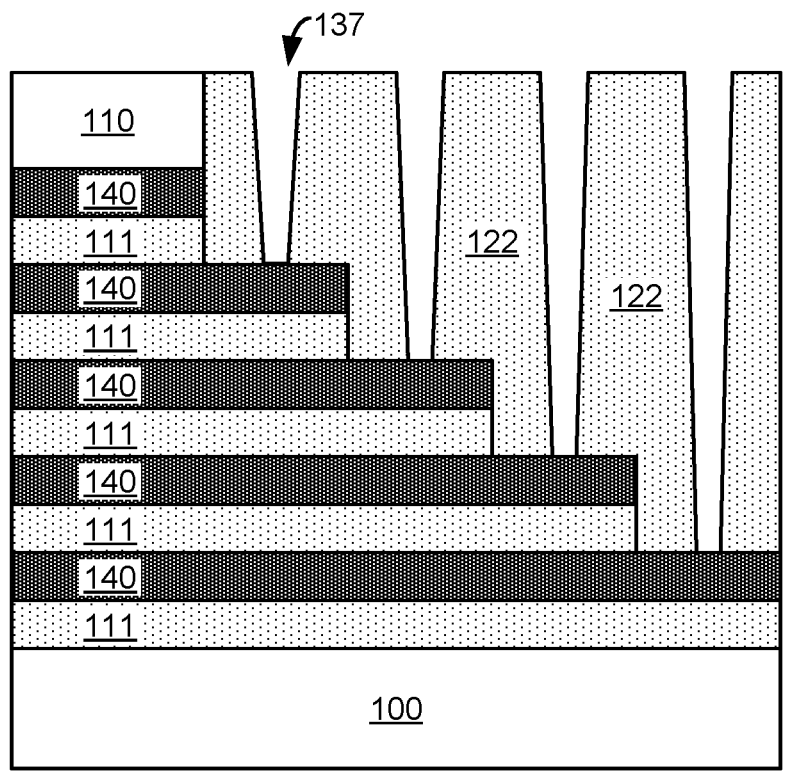
Figure 12:
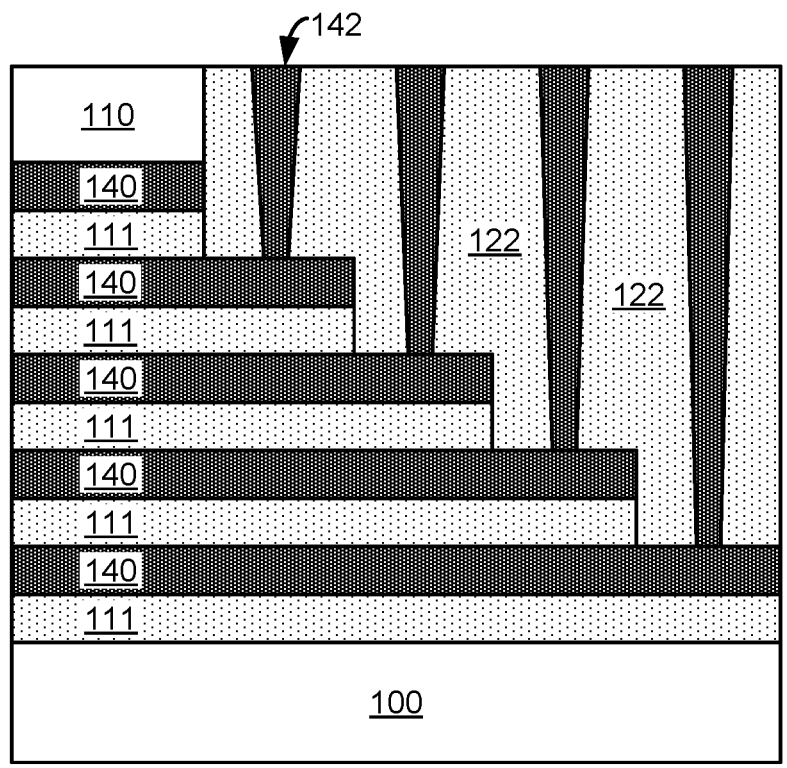

In operation 214, the doped oxide film 122 is vertically etched to form vias 137. The oxide may be etched by dry etching using exposure to one or more of the following gases: $O_2$, Ar, $C_4F_6$, $C_4F_8$, $SF_6$, $CHF_3$, and CF4. FIG. 11 shows an example substrate 100 including the oxide/conductor stack in a staircase pattern whereby vias 137 are etched in the doped oxide 122.

Further in operation 214, a conductor, e.g., tungsten, may be deposited in the vias 137 to form interconnects 142 to the wordlines to complete the 3D NAND structure.

Accordingly, another aspect involves a method of conducting a large area gap fill in fabrication of a 3D NAND structure. The method involves providing a patterned semiconductor substrate comprising a 3D NAND structure having alternating oxide and nitride or polysilicon layers in a staircase pattern, depositing on the patterned semiconductor substrate over the staircase pattern a doped silicon oxide film, the film having a thickness of at least 5 μm, or at least 10 μm, or 20 μm or more, and annealing the doped silicon oxide film to a temperature above the film glass transition temperature. In some embodiments, reflow of the film may occur. The doped silicon oxide film is deposited by a chemical vapor deposition (CVD) process using precursors for silicon oxide and a dopant selected from the group consisting of B, P, Ge, and combinations thereof. The silicon oxide precursor may be tetraethyl orthosilicate (TEOS), the doped silicon oxide film may have a dopant concentration in the range of up to about 10 wt % of the film, and the doped silicon oxide film on the substrate may exhibit substantially zero as-deposited stress, substantially zero stress shift post-anneal, and substantially zero shrinkage post-anneal. An undoped silicon oxide capping layer may be deposited on the doped silicon oxide film. Other potential features, including material composition, dimensions and properties, are described herein above.

And accordingly, another aspect involves a semiconductor device, including a 3D NAND structure having alternating oxide and nitride or polysilicon layers in a staircase pattern, and a doped silicon oxide film disposed and annealed on the staircase pattern, the film having a thickness of at least 5 µm. The doped silicon oxide film is doped with a dopant selected from the group consisting of B, P, Ge, and combinations thereof, and the doped silicon oxide film disposed and annealed on the staircase pattern exhibits substantially zero as-deposited stress, substantially zero stress shift post-anneal, and substantially zero shrinkage post-anneal. Other potential features of such a device, including material composition, dimensions and properties, are described herein above, with reference to the fabrication methods.

Apparatus

Another aspect involves an apparatus for processing a semiconductor substrate by depositing on a patterned semiconductor substrate a doped silicon oxide film, the apparatus including: a reaction chamber including the substrate; a plasma source coupled to the reaction chamber and configured to generate a plasma outside the reaction chamber; one or more first gas inlets coupled to the reaction chamber; a second gas inlet coupled to the reaction chamber; and a controller including instructions for performing the following operations: depositing on a patterned semiconductor substrate disposed in the chamber a doped silicon oxide film, the film having a thickness of at least 5 µm; and annealing the doped silicon oxide film to a temperature above the film glass transition temperature. In some embodiments, reflow of the film may occur. The composition and processing conditions of the doped silicon oxide film may be tailored so that the film exhibits substantially zero as-deposited stress, substantially zero stress shift post-anneal, and substantially zero shrinkage post-anneal. For example, the doped silicon oxide film may be deposited by a chemical vapor deposition (CVD) process using precursors for silicon oxide and a dopant selected from the group consisting of B, P, Ge, and combinations thereof. The silicon oxide precursor may be tetraethyl orthosilicate (TEOS). The description that following provides some details of apparatus-semiconductor chambers and tools-suitable for implementation of the methods described herein and to fabricate the described devices.

Figure 14:
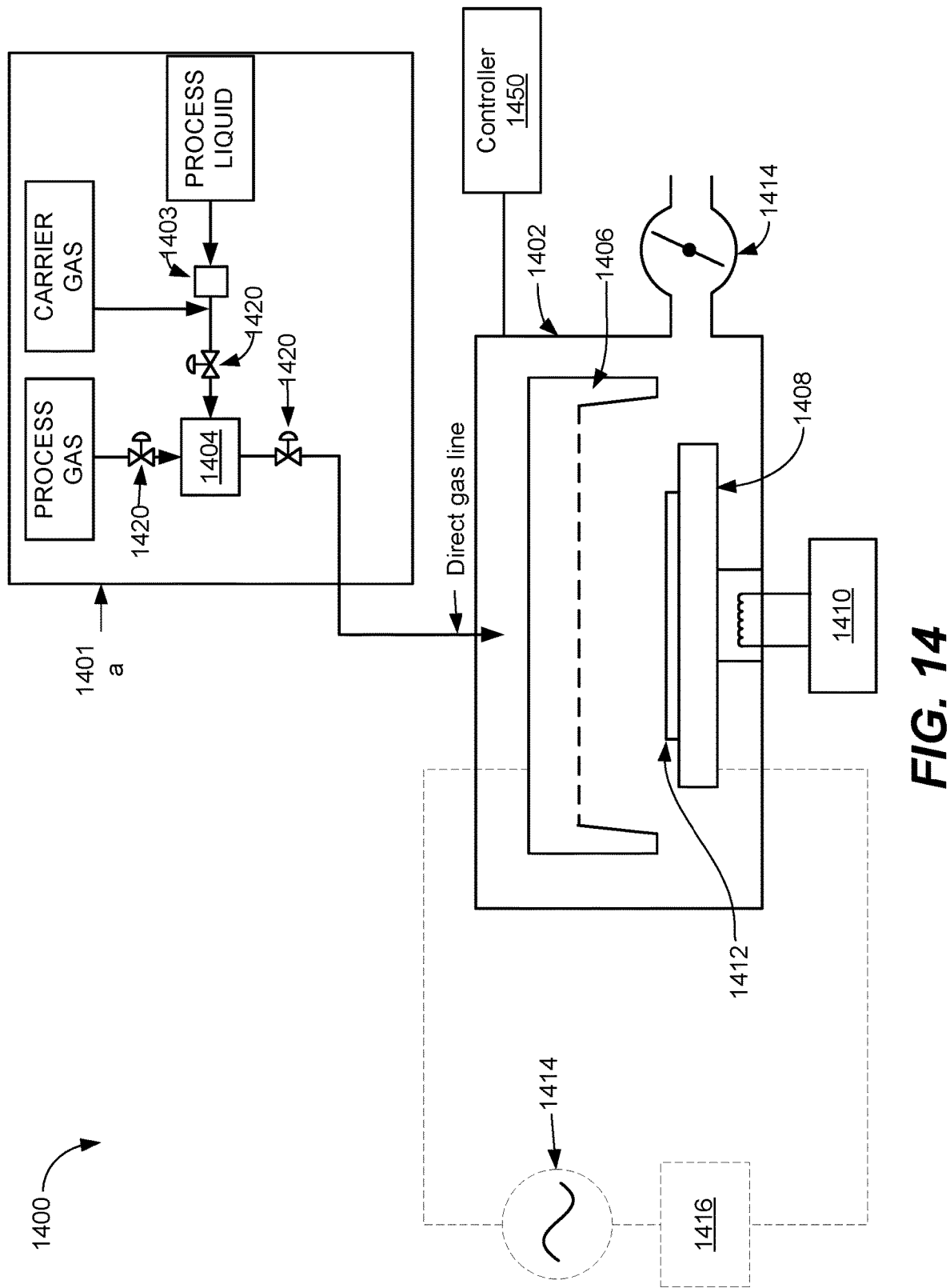
FIGS. 14-16 are schematic illustrations of example process chambers and tools for performing certain disclosed embodiments.
Figure 15:
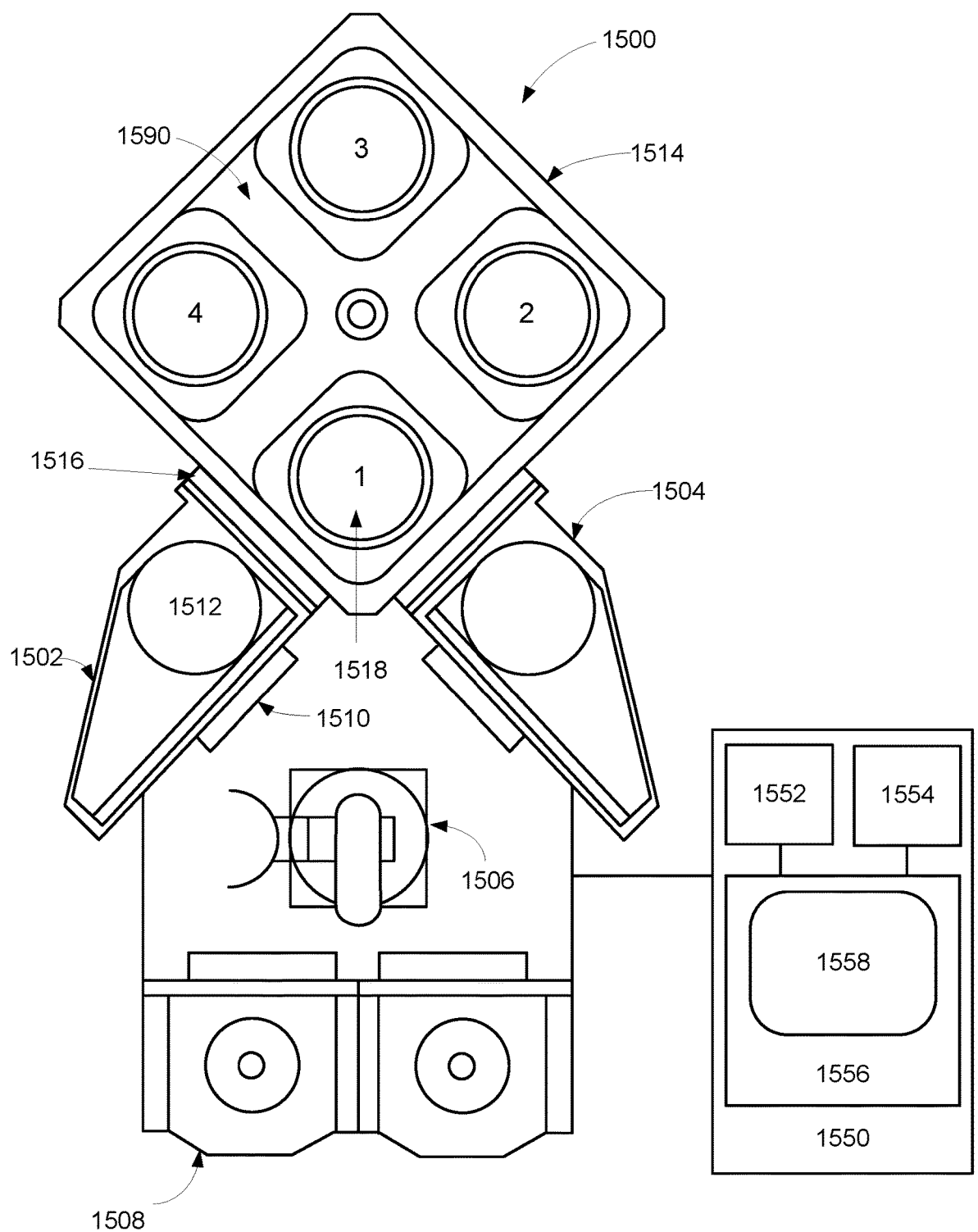

FIG. 14 depicts a schematic illustration of an embodiment of deposition process chamber 1400 that may be suitable for depositing and processing films as described herein. The chamber may be operated as a chemical vapor deposition (CVD) chamber, in particular a plasma enhanced CVD (PECVD) chamber. An example is the Vector™ Strata tool available from Lam Research Corporation, Fremont, CA. The chamber 1400 has a process chamber body 1402 for maintaining a low pressure environment. A plurality of process stations 1400 may be included in a common low pressure process tool environment. For example, FIG. 15 depicts an embodiment of a multi-station processing tool 1900. In some embodiments, one or more hardware parameters of the process station 1400, including those discussed in detail below, may be adjusted programmatically by one or more computer controllers 1450.

Process station 1400 fluidly communicates with reactant delivery system 1401a for delivering process gases to a distribution showerhead 1406. Reactant delivery system 1401a includes a mixing vessel 1404 for blending and/or conditioning process gases, such as a silicon oxide precursor gas (e.g., TEOS) or second reactant gas (e.g., a dopant reactant), for delivery to showerhead 1406. One or more mixing vessel inlet valves 1420 may control introduction of process gases to mixing vessel 1404. Plasma may also be delivered to the showerhead 1406 or may be generated in the process station 1400. Reactant delivery system 1401a may be configured to deliver process gases for depositing a doped oxide film over a substrate provided in the process station 1400.

As an example, the embodiment of FIG. 14 includes a vaporization point 1403 for vaporizing liquid reactant to be supplied to the mixing vessel 1404. In some embodiments, vaporization point 1403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 1403 may be heat traced. In some examples, mixing vessel 1404 may also be heat traced. In one non limiting example, piping downstream of vaporization point 1403 has an increasing temperature profile extending from approximately 100° C. to approximately 150° C. at mixing vessel 1404.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 1403. In one scenario, a liquid injector may be mounted directly to mixing vessel 1404. In another scenario, a liquid injector may be mounted directly to showerhead 1406.

In some embodiments, a liquid flow controller (LFC) upstream of vaporization point 1403 may be provided for controlling a mass flow of liquid for vaporization and delivery to process station 1400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 1406 distributes process gases toward substrate 1152. In the embodiment shown in FIG. 14, the substrate 1152 is located beneath showerhead 1406 and is shown resting on a pedestal 1408. Showerhead 1406 may have any suitable shape, and may have any suitable number and arrangement of ports for distributing process gases to substrate 1152.

In some embodiments, pedestal 1408 may be raised or lowered to expose substrate 1412 to a volume between the substrate 1412 and the showerhead 1406. It will be appreciated that, in some embodiments, pedestal height may be adjusted programmatically by a suitable computer controller 1450.

In another scenario, adjusting a height of pedestal 1408 may allow a plasma density to be varied during plasma activation cycles in the process in embodiments where a plasma is ignited. At the conclusion of the process phase, pedestal 1408 may be lowered during another substrate transfer phase to allow removal of substrate 1412 from pedestal 1408.

In some embodiments, pedestal 1408 may be temperature controlled via heater 1410. In some embodiments, the pedestal 1408 may be heated to a temperature of at least about 400° C., or in some embodiments, less than about 300° C., such as about 250° C., during deposition of silicon nitride films as described in disclosed embodiments. In some embodiments, the pedestal is set at a temperature between about 400° C. and about 600° C. for doped oxide film deposition. In some embodiments, the pedestal is set at a temperature between about 500° C. and about 950° C. for annealing of a doped oxide film, as described herein.

Further, in some embodiments, pressure control for process station 1400 may be provided by butterfly valve 1418. As shown in the embodiment of FIG. 14, butterfly valve 1418 throttles a vacuum provided by a downstream vacuum pump (not shown). However, in some embodiments, pressure control of process station 1400 may also be adjusted by varying a flow rate of one or more gases introduced to the process station 1400.

In some embodiments, a position of showerhead 1406 may be adjusted relative to pedestal 1408 to vary a volume between the substrate 1412 and the showerhead 1406. Further, it will be appreciated that a vertical position of pedestal 1408 and/or showerhead 1406 may be varied by any suitable mechanism within the scope of the present disclosure. In some embodiments, pedestal 1408 may include a rotational axis for rotating an orientation of substrate 1412. It will be appreciated that, in some embodiments, one or more of these example adjustments may be performed programmatically by one or more suitable computer controllers 1450.

In some embodiments where plasma may be used as discussed above, showerhead 1406 and pedestal 1408 electrically communicate with a radio frequency (RF) power supply 1414 and matching network 1416 for powering a plasma. In some embodiments, the plasma energy may be controlled by controlling one or more of a process station pressure, a gas concentration, an RF source power, an RF source frequency, and a plasma power pulse timing. For example, RF power supply 1414 and matching network 1416 may be operated at any suitable power to form a plasma having a desired composition of radical species. Examples of suitable powers are included above. Likewise, RF power supply 1414 may provide RF power of any suitable frequency. In some embodiments, RF power supply 1414 may be configured to control high- and low-frequency RF power sources independently of one another. Example low frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 180 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 1450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. It will be appreciated that these recipe phases may be further subdivided and/or iterated in any suitable way within the scope of the disclosed embodiments.

As described above, one or more process chambers may be included as stations in a multi station processing tool. FIG. 15 shows a schematic view of an embodiment of a multi station processing tool 1500 that includes a processing chamber 1514 having a plurality of processing stations in a low-pressure environment. The processing chamber 1514 may be configured to maintain a low pressure environment so that substrates may be transferred among the process stations without experiencing a vacuum break and/or air exposure.

The tool 1500 further includes an inbound load lock 1502 and an outbound load lock 1504, either or both of which may include a remote plasma source. A robot 1506 at atmospheric pressure is configured to move wafers from a cassette loaded through a pod 1508 into inbound load lock 1502 via an atmospheric port 1510. A wafer is placed by the robot 1506 on a pedestal 1512 in the inbound load lock 1502, the atmospheric port 1510 is closed, and the load lock is pumped down. Where the inbound load lock 1502 includes a remote plasma source, the wafer may be exposed to a remote plasma treatment in the load lock prior to being introduced into a processing chamber 1514. Further, the wafer also may be heated in the inbound load lock 1502 as well, for example, to remove moisture and adsorbed gases. Next, a chamber transport port 1516 to processing chamber 1514 is opened, and another robot (not shown) places the wafer into the reactor on a pedestal of a first station shown in the reactor for processing. While the embodiment depicted in FIG. 15 includes load locks, it will be appreciated that, in some embodiments, direct entry of a wafer into a process station may be provided.

The depicted processing chamber 1514 includes four process stations, numbered from 1 to 4 in the embodiment shown in FIG. 15. Each processing station may be configured to deposit TEOS-based silicon dioxide and silane-based silicon nitride. Each processing station is supplied by a common mixing vessel (1404, for example in FIG. 14) for blending and/or conditioning process gases prior to delivery to each processing station. Each process station depicted in FIG. 15 includes a process station substrate holder (shown at 1518 for station 1) and process gas delivery line inlets. In some embodiments, one or more process station substrate holders 1518 may be heated.

In some embodiments, each process station may have different or multiple purposes. For example, a process station may be switchable between an ultra-smooth PECVD process mode and a conventional PECVD or CVD mode. Additionally or alternatively, in some embodiments, processing chamber 1514 may include one or more matched pairs of ultra-smooth PECVD and conventional PECVD stations (e.g., a pair including an ultrasmooth PECVD $SiO_2$ station and a conventional PECVD SiN station). In another example, a process station may be switchable between two or more film types, so that stacks of different film types may be deposited in the same process chamber. While the depicted processing chamber 1514 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 15 also depicts an embodiment of a substrate handling system 1590 for transferring substrates within processing chamber 1514. In some embodiments, substrate handling system 1590 may be configured to transfer substrates between various process stations and/or between a process station and a load lock. It will be appreciated that any suitable substrate handling system may be employed. Non-limiting examples include substrate carousels and substrate handling robots.

The multi-station processing tool 1500 also includes an embodiment of a system controller 1550 employed to control process conditions and hardware states of processing tool 1500. For example, in some embodiments, system controller 1550 may control one or more process parameters during a PECVD film deposition phase to control features of a deposited film, including the composition and thickness of the deposited film, etc.

System controller 1550 may include one or more memory devices 1556, one or more mass storage devices 1554, and one or more processors 1552. Processor 1552 may include a CPU or computer, analog and/or digital input/output connections, stepper motor controller boards, etc.

In some embodiments, system controller 1550 controls all of the activities of processing tool 1500. System controller 1550 executes machine-readable system control software 1558 stored in mass storage device 1554, loaded into memory device 4256, and executed on processor 1552. System control software 1558 may include instructions for controlling the timing, mixture of gases, chamber and/or station pressure, chamber and/or station temperature, substrate temperature, target power levels, RF power levels, substrate pedestal, chuck and/or susceptor position, and other parameters of a particular process performed by processing tool 1500. System control software 1558 may be configured in any suitable way. For example, various process tool component subroutines or control objects may be written to control operation of the process tool components for performing various process tool processes. System control software 1558 may be coded in any suitable computer readable programming language.

In some embodiments, system control software 1558 may include input/output control (IOC) sequencing instructions for controlling the various parameters described above. For example, each phase of a PECVD process may include one or more instructions for execution by system controller 1550. The instructions for setting process conditions for a PECVD process phase may be included in a corresponding PECVD recipe phase, for example a thick doped silicon oxide film deposition as described herein. In some embodiments, the PECVD recipe phases may be sequentially arranged, so that all instructions for a PECVD process phase are executed concurrently with that process phase.

Other computer software and/or programs stored on mass storage device 1554 and/or memory device 1556 associated with system controller 1550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto process station substrate holder 1518 and to control the spacing between the substrate and other parts of processing tool 1500.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 1550. The user interface may include a display screen, graphical software displays of the apparatus and/or process conditions, and user input devices such as pointing devices, keyboards, touch screens, microphones, etc.

In some embodiments, parameters adjusted by system controller 1550 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 1550 from various process tool sensors. The signals for controlling the process may be output on the analog and digital output connections of processing tool 1500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

In some implementations, the system controller 1550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 1550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 1550, in some implementations, may be a part of or coupled to a computer that is integrated with, coupled to the system, otherwise networked to the system, or a combination thereof. For example, the system controller 1550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1550 receives instructions in the form of data, which specify parameters for each of the processing steps to be performed during one or more operations. It should be understood that the parameters may be specific to the type of process to be performed and the type of tool that the system controller 1550 is configured to interface with or control. Thus as described above, the system controller 1550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a chemical vapor deposition (CVD/PECVD) chamber or module, a plasma etch chamber or module, a track chamber or module, and any other semiconductor processing systems that may be associated or used in the fabrication and/or manufacturing of semiconductor wafers. Etching operations described herein, such as for etching nitride or oxide, may be performed in any suitable process chamber. In some embodiments, substrates may be etched in an adjustable gap capacitively coupled confined RF plasma reactor, such as the Flex™ tool available from Lam Research Corporation, Fremont, CA, that may be used for performing the etching operations described herein.

As noted above, depending on the process step or steps to be performed by the tool, the system controller 1550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 16:
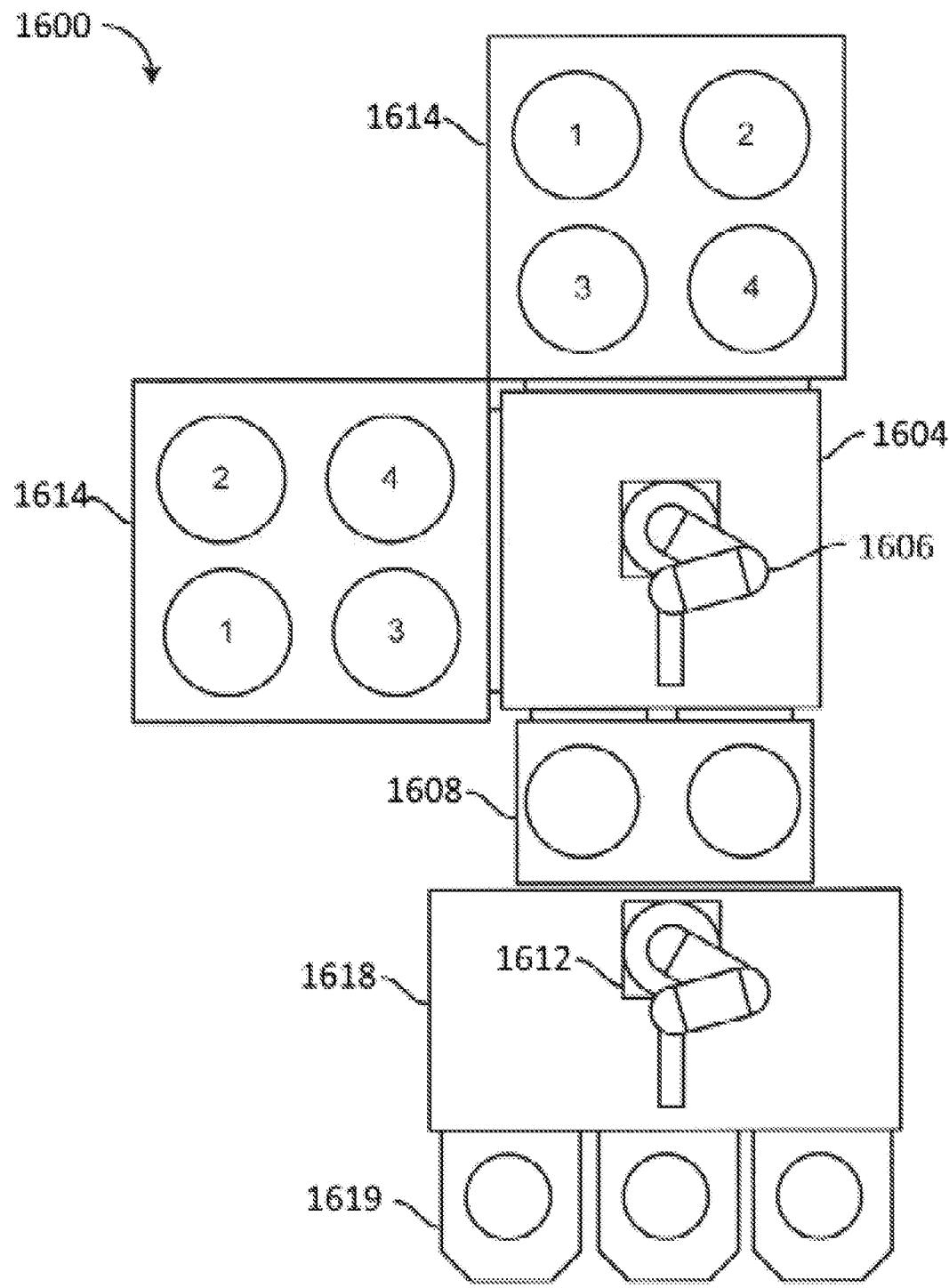

It will be appreciated that, in some embodiments, a low-pressure transfer chamber may be included in a multi-station processing tool to facilitate transfer between a plurality of processing chambers. For example, FIG. 16 schematically shows another embodiment of a multi-station processing tool 1600. In the embodiment shown in FIG. 16, multi-station processing tool 1600 includes a plurality of processing chambers 1614 including a plurality of process stations (numbered 1 through 4). Processing chambers 1614 are interfaced with a low-pressure transport chamber 1604 including a robot 1606 configured to transport substrates between processing chambers 1614 and load lock 1619. An atmospheric substrate transfer module 1610, including an atmospheric robot 1612, is configured to facilitate transfer of substrates between load lock 1619 and pod 1608. While not shown in FIG. 16, it will be appreciated that the embodiment of multi-station processing tool 1600 may include a suitable system controller like the embodiment of system controller 1550 shown in and described with reference to FIG. 15.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a semiconductor substrate, the method comprising:
   providing a patterned semiconductor substrate;
   depositing on the patterned semiconductor substrate a doped silicon oxide film, wherein the doped silicon oxide film has a thickness of at least 5 μm; and
   annealing the doped silicon oxide film to a temperature above the film glass transition temperature,
      wherein the doped silicon oxide film is deposited by a chemical vapor deposition (CVD) process using precursors for silicon oxide and a dopant selected from the group consisting of B, P, and Ge, and
      wherein each of the precursors for the dopant is selected from the group consisting of triethylborate (TEB), triethylphosphate (TEPO), and an organogermanium compound.

2. The method of claim 1, wherein the silicon oxide precursor is tetraethyl orthosilicate (TEOS).

3. The method of claim 1, wherein the CVD is a plasma enhanced CVD (PECVD) process.

4. The method of claim 1, further comprising depositing an undoped silicon oxide capping layer on the doped silicon oxide film.

5. The method of claim 1, wherein the doped silicon oxide film has a dopant concentration in the range of up to about 10 wt % of the film; or 0.5 to 10%; or 2-5%; or 2.5-3.5%.

6. The method of claim 5, wherein the doped silicon oxide film has a dopant concentration in the range of about 0 to 10 wt % of the film B, 0 to 10% P, 0 to 10% Ge.

7. The method of claim 1, wherein the patterned semiconductor substrate is a 3D NAND structure having alternating oxide and nitride or polysilicon layers in a staircase pattern, and the doped silicon oxide film is deposited over the staircase pattern.

8. The method of claim 1, wherein the doped silicon oxide film has a thickness of at least 10 μm.

9. The method of claim 1, wherein the doped silicon oxide film is deposited at a thickness up to 20 μm by a single-pass deposition.

10. The method of claim 1, wherein the doped silicon oxide film is deposited at a rate of at least 1 μm per minute.

11. The method of claim 1, wherein the annealing of the doped silicon oxide film causes reflow of the film to occur.

12. A semiconductor device, comprising:
   a 3D NAND structure having alternating oxide and nitride or polysilicon layers in a staircase pattern; and
   a doped silicon oxide film disposed and annealed on the staircase pattern, wherein the doped silicon oxide film has a thickness of at least 5 μm,
   wherein the doped silicon oxide film is deposited by a chemical vapor deposition (CVD) process using precursors for silicon oxide and a dopant selected from the group consisting of B, P, and Ge,
   wherein each of the precursors for the dopant is selected from the group consisting of triethylborate (TEB), triethylphosphate (TEPO), and an organogermanium compound, and
   wherein the doped silicon oxide film disposed and annealed on the staircase pattern exhibits substantially zero as-deposited stress, substantially zero stress shift post-anneal, and substantially zero shrinkage post-anneal.

13. The semiconductor device of claim 12, wherein the doped silicon oxide film has a dopant concentration in the range of up to about 10 wt % of the film; or 0.5 to 10%; or 2-5%; or 2.5-3.5%.

14. The semiconductor device of claim 13, wherein the doped silicon oxide film has a dopant concentration in the range of about 0 to 10 wt % of the film B, 0 to 10% P, 0 to 10% Ge.

15. The semiconductor device of claim 12, wherein the doped silicon oxide film has a thickness of at least 10 μm.

16. An apparatus for processing substrates, the apparatus comprising:
   a process chamber having a chuck;
   a gas source connected with the process chambers and associated flow-control hardware;
   substrate handling hardware; and
   a controller having a processor and a memory, wherein:
      the processor and the memory are communicatively connected with one another,
      the processor is at least operatively connected with the flow-control and substrate handling hardware, and
      the memory stores computer-executable instructions for controlling the processor to at least control the flow-control hardware and substrate handling hardware by:
         providing a patterned semiconductor substrate;
         depositing on a patterned semiconductor substrate disposed in the chamber a doped silicon oxide film having a thickness of at least 5 μm; and
         annealing the doped silicon oxide film to a temperature above the film glass transition temperature,
            wherein the doped silicon oxide film is deposited by a chemical vapor deposition (CVD) process using precursors for silicon oxide and a dopant selected from the group consisting of B, P, and Ge, and
            wherein each of the precursors for the dopant is selected from the group consisting of triethylborate (TEB), triethylphosphate (TEPO), and an organogermanium compound.

17. The apparatus of claim 16, wherein the annealing of the doped silicon oxide film causes reflow of the film to occur.

* * * * *